United States Patent
Bhavnagarwala et al.

(10) Patent No.: US 9,990,992 B2
(45) Date of Patent: Jun. 5, 2018

(54) METHOD, SYSTEM AND DEVICE FOR NON-VOLATILE MEMORY DEVICE OPERATION

(71) Applicant: ARM Ltd., Cambridge (GB)

(72) Inventors: Azeez Jennudin Bhavnagarwala, Newtown, CT (US); Lucian Shifren, San Jose, CA (US); Piyush Agarwal, Noida (IN); Akshay Kumar, New Delhi (IN); Robert Campbell Aitken, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days. days.

(21) Appl. No.: 15/334,187

(22) Filed: Oct. 25, 2016

(65) Prior Publication Data
US 2018/0114574 A1 Apr. 26, 2018

(51) Int. Cl.
*G11C 11/00* (2006.01)
*G11C 13/00* (2006.01)

(52) U.S. Cl.
CPC .............................. *G11C 13/0069* (2013.01)

(58) Field of Classification Search
CPC .............. G11C 13/0069; G11C 13/004; G11C 13/0007; G11C 13/003; G11C 13/0002; G11C 13/0011; G11C 2213/15
See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,514,814 B1 * | 12/2016 | Sandhu | G11C 13/0069 |
| 9,548,118 B1 * | 1/2017 | Bhavnagarwala . | G11C 13/0069 |
| 9,558,819 B1 | 1/2017 | Aitken et al. | |
| 9,584,118 B1 | 2/2017 | Dao et al. | |
| 9,589,636 B1 * | 3/2017 | Bhavnagarwala . | G11C 13/0002 |
| 2005/0045919 A1 | 3/2005 | Kaeriyama et al. | |
| 2008/0106925 A1 | 5/2008 | Paz De Araujo et al. | |
| 2008/0106926 A1 | 5/2008 | Brubaker | |
| 2008/0107801 A1 | 5/2008 | Celinska et al. | |
| 2013/0200323 A1 | 8/2013 | Pham et al. | |
| 2013/0214232 A1 | 8/2013 | Tendulkar et al. | |
| 2013/0285699 A1 | 10/2013 | McWilliams et al. | |
| 2014/0104927 A1 | 4/2014 | Sutardja et al. | |
| 2017/0033782 A1 | 2/2017 | Shifren et al. | |

(Continued)

OTHER PUBLICATIONS

Notification of Transmittal of the International Search Report and The Written Opinion of the International Searching Authority, or the Declaration, dated Jan. 24, 2018, International Application No. PCT/GB2017/053201, 1 pg.

(Continued)

*Primary Examiner* — Hien Nguyen
(74) *Attorney, Agent, or Firm* — Berkeley Law & Technology Group, LLP

(57) ABSTRACT

Disclosed are methods, systems and devices for operation of non-volatile memory devices. In one aspect, a correlated electron switch (CES) device may be placed in any one of multiple memory states in a write operation. A plurality of bitcells may be connectable to a common source voltage during a two-phase operation to place individual bitcells in intended impedance states.

13 Claims, 6 Drawing Sheets

(56) References Cited

U.S. PATENT DOCUMENTS

| | | |
|---|---|---|
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |

OTHER PUBLICATIONS

The International Search Report, dated Jan. 24, 2018, International Application No. PCT/GB2017/053201, 5 pgs.
The Written Opinion of the International Searching Authority, dated Jan. 24, 2018, International Application No. PCT/GB2017/053201, 11 pgs.

* cited by examiner

US 9,990,992 B2

METHOD, SYSTEM AND DEVICE FOR NON-VOLATILE MEMORY DEVICE OPERATION

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and $\epsilon$ of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments are still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need in the art for a non-volatile memory that is deterministic has low power, high speed, high density and stability, and in particular, such a memory that is scalable to feature sizes well below 65 nanometers (nm).

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may be best understood by reference to the following detailed description if read with the accompanying drawings in which:

Figure 1A:
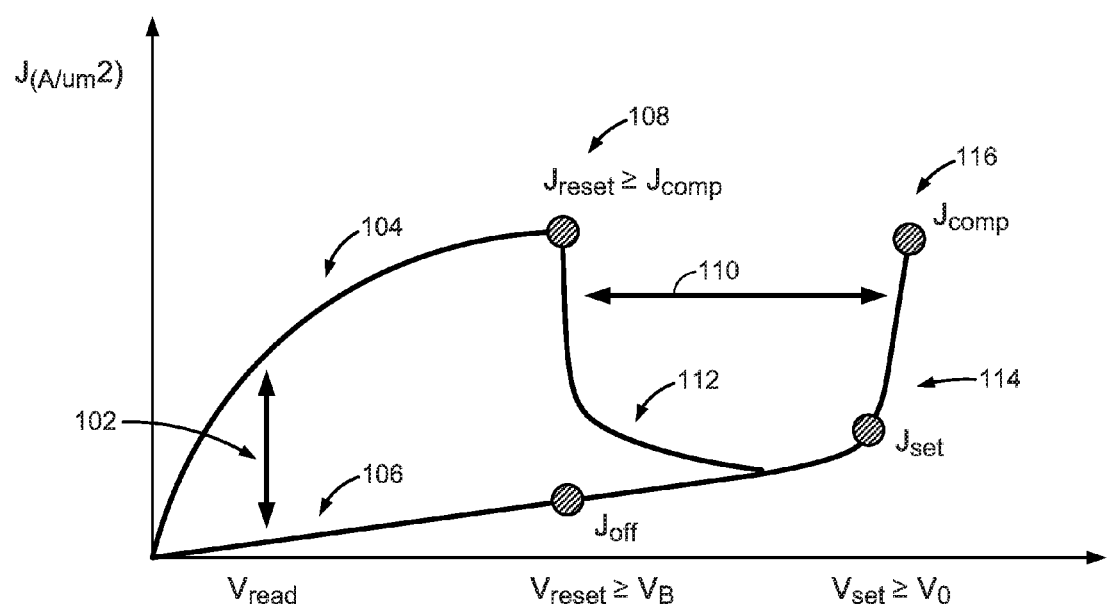
FIG. 1A shows a plot of current density versus voltage for a CES device according to an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Particular aspects of the present disclosure incorporate a Correlated Electron Material (CEM) to form a correlated electron switch (CES). In this context, a CES may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES between an insulative state and a conductive state may be understood in terms of a Mott transition. In a Mott transition, a material may switch from an insulative state to conductive state if a Mott transition condition occurs. The criteria may be defined by the condition $(n_C)^{1/3} a=0.26$, where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES device; a write circuit for placing the resistive switching memory cell in a first resistive state or a second resistive state depending on signals provided to the memory cell, wherein a resistance of the CES is higher in the second resistance state than in the first resistance state; and a read circuit for sensing the state of the memory cell and providing an electrical signal corresponding to the sensed state of the memory cell. In one aspect, a resistance of a CES in the second memory cell state may be more than 100 times the resistance in the second memory cell state. In a particular implementation, a CES device may switch resistive states responsive to a Mott-transition in the majority of the volume of the CES device. In one aspect, a CES device may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A shows a plot of current density versus voltage across terminals (not shown) for a CES device according to an embodiment. Based, at least in part, on a voltage applied to terminals of the CES device (e.g., in a write operation), the CES may be placed in a conductive state or an insulative state. For example application of a voltage $V_{set}$ and current density $J_{set}$ may place the CES device in a conductive memory state and application of a voltage $V_{reset}$ and a current density $J_{reset}$ may place the CES device in an insulative memory state. Following placement of the CES in an insulative state or conductive memory state, the particular state of the CES device may be detected by application of a voltage $V_{read}$(e.g., in a read operation) and detection of a current or current density at terminals of the CeRAM device.

According to an embodiment, the CES device of FIG. 1A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES device may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES device is still in the insulative state, current may generated by transportation of electron holes. If enough bias is applied across terminals of the CES, electrons may be injected into a metal-insulator-metal (MIM) diode over the potential barrier of the MIM device. If enough electrons have been injected and enough potential is applied across terminals to place the CES device in a set state, an increase in electrons may screen electrons and remove a localization of electrons, which may collapse the band-splitting potential forming a metal.

According to an embodiment, current in a CES device may be controlled by an externally applied "compliance" condition determined based, at least in part, on the external current limited during a write operation a write operation to place the CES device in a conductive state. This externally applied compliance current may also set a condition of a current density for a subsequent reset operation to place the CES in an insulative state. As shown in the particular implementation of FIG. 1A, a current density $J_{comp}$ applied during a write operation at point 116 to place the CES device in an conductive state may determine a compliance condition for placing the CES device in insulative state in a subsequent write operation. As shown, the CES device may be subsequently placed in an insulative state by application of a current density $J_{reset} \geq J_{comp}$ at a voltage $V_{reset}$ at point 108, where $J_{comp}$ is externally applied.

The compliance condition therefore may determine a number of electrons in a CES device which are to be "captured" by holes for the Mott transition. In other words, a current applied in a write operation to place a CES device in a conductive memory state may determine a number of holes to be injected to the CES device for subsequently transitioning the CES device to an insulative memory state.

As pointed out above, a reset condition may occur in response to a Mott transition at point 108. As pointed out above, such a Mott transition may occur at condition in a CES device in which a concentration of electrons n equals a concentration of electron holes p. This condition may be modeled according to expression (1) as follows:

$$\lambda_{TF} n^{\frac{1}{3}} = C \sim 0.26 \qquad (1)$$

$$n = \left(\frac{C}{\lambda_{TF}}\right)^3$$

where:
$\lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES device. Here, injection of holes may meet a Mott transition criterion for the conductive state to insulative state transition at current $I_{MI}$ as a critical voltage $V_{MI}$ is applied across terminals of CES device. This may be modeled according to expression (3) as follows:

$$I_{MI}(V_{MI}) = \frac{dQ(V_{MI})}{dt} \approx \frac{Q(V_{MI})}{t} \quad (3)$$

$$Q(V_{MI}) = qn(V_{MI})$$

Where $Q(V_{MI})$ is the charged injected (hole or electron) and is a function of an applied voltage.

Injection of electron holes to enable a Mott transition may occur between bands and in response to critical voltage $V_{MI}$ and critical current $I_{MI}$. By equating electron concentration n with a charge concentration to bring about a Mott transition by holes injected by $I_{MI}$ in expression (3) according to expression (1), a dependency of such a critical voltage $V_{MI}$ on Thomas Fermi screening length $\lambda_{TF}$ may be modeled according to expression (4) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (4)$$

$$J_{reset}(V_{MI}) = J_{MI}(V_{MI}) = \frac{I_{MI}(V_{MI})}{A_{CeRam}} = \frac{q}{A_{CeRam}t}\left(\frac{C}{\lambda_{TF}(V_{MI})}\right)^3$$

Where:

$A_{CeRam}$ is a cross-sectional area of a CES element; and $J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES to the conductive memory state at a critical voltage $V_{MI}$ enabling transition to the conductive memory state may be expressed according to expression (6) as follows:

$$I_{MI}(V_{MI}) = \frac{dQ(V_{MI})}{dt} \approx \frac{Q(V_{MI})}{t} \quad (6)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{MI}) =$$

$$J_{injection}(V_{MI}) = J_{MI}(V_{MI}) = \frac{I_{MI}(V_{MI})}{A_{CeRam}} = \frac{q}{A_{CeRam}t}\left(\frac{C}{a_B}\right)^3$$

where:

$AB$ is a Bohr radius.

According to an embodiment, a "read window" 102 for detecting a memory state of a CES device in a read operation may be set out as a difference between a portion 106 the plot of FIG. 1A while the CES device is in an insulative state and a portion 104 of the plot FIG. 1A while the CES device is in a conductive state at a read voltage $V_{read}$. In a particular implementation, read window 102 may be used to determine a Thomas Fermi screening length $\lambda_{TF}$ of material making up the CES device. For example, at a voltage $V_{reset}$, current densities $J_{reset}$ and $J_{set}$ may be related to according to expression (7) as follows:

$$\lambda_{TF}(@V_{reset}) = a_B\left(\frac{J_{reset}}{J_{off}}\right)^{\frac{1}{3}} \quad (7)$$

In another embodiment, a "write window" 110 for placing a CES device in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined, at least in part, by materials and doping of the CES device.

Figure 1B:
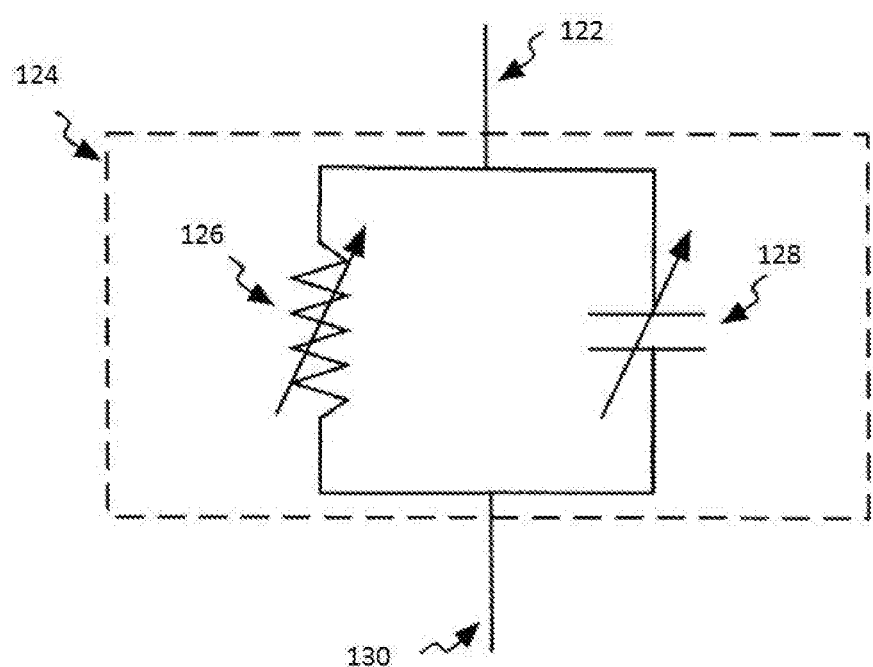
FIG. 1B is a schematic diagram of an equivalent circuit to a CES device according to an embodiment.

The transition from high resistance/capacitance to low resistance/capacitance in a CES device may be represented by a singular impedance of the CES device. FIG. 1B depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM comprises characteristics of variable capacitance and variable resistance. Table 1 below depicts an example truth table for an example variable impeder device, such as variable impeder device 100.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

Figure 2:
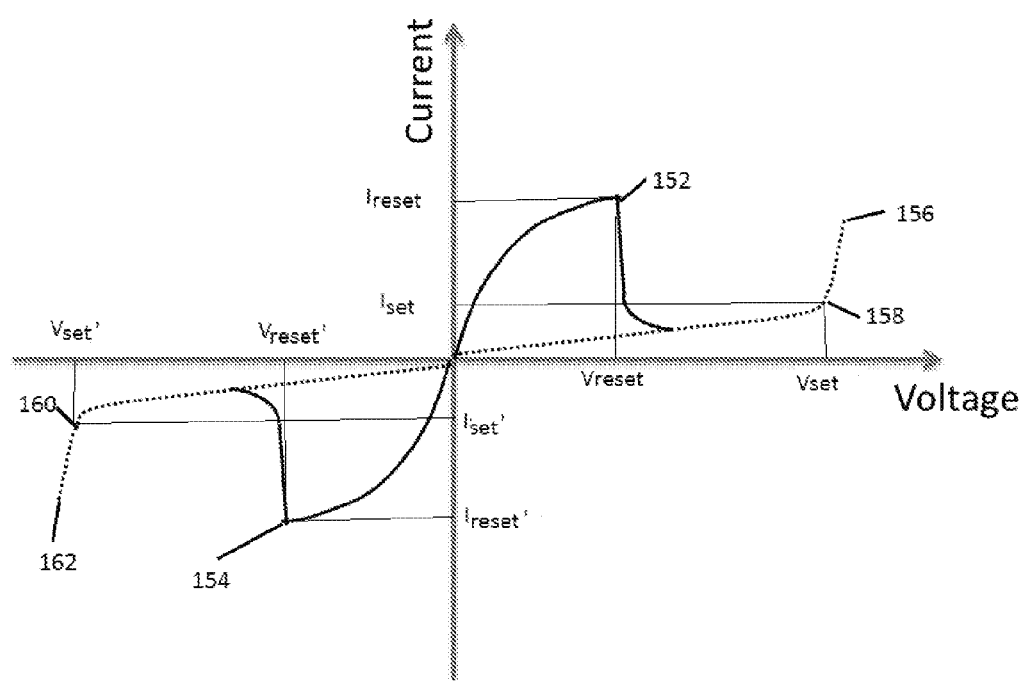
FIG. 2 is a plot illustrating symmetrical operation of a CES device according to an embodiment.

As may be observed from the plot of FIG. 1A, a programming signal to place a CES in a low impedance or conductive state may satisfy a set voltage condition having a positive polarity and a set current condition having a positive polarity. Likewise a programming signal to place a CES in a high impedance or insulative state may satisfy a reset voltage condition having a positive polarity and a reset current condition having a positive polarity. In particular embodiments, as illustrated in FIG. 2, a write operation may be performed by meeting alternative voltage and current conditions in different polarities. In this context, operation in the voltage versus current plot of FIG. 2 with current and voltage both having a positive polarity places operation in the first quadrant while operation with current and voltage having a negative polarity places operation in the third quadrant. For example, point 158 may define a first set voltage condition of $V_{set}$ and a first set current condition $I_{set}$ in a first quadrant while point 160 may define a second set voltage condition of $V_{set}'$ and a second reset current condition $I_{set}'$ in a third quadrant. In other words a particular CES device having operational characterized by the plot of FIG. 2 may be placed in a low impedance or conductive state by application of a programming signal having a voltage $V_{set}$ and a current $I_{set}$ (at point 158), or by application of a programming signal having a voltage $V_{set}'$ and a current $I_{set}'$ (at point 160).

Likewise, point 152 may define a first reset voltage condition of $V_{reset}$ and a first reset current condition $I_{reset}$ in a first quadrant while point 154 may define a second reset voltage condition of $V_{reset}'$ and a second reset current condition $I_{reset}'$ in a third quadrant. In other words a particular CES device having operational characterized by the plot of FIG. 2 may be placed in a high impedance or insulative state by application of a programming signal having a voltage $V_{reset}$ and a current $I_{reset}$ (at point 152), or by application of a programming signal having a voltage $V_{reset}'$ and a current $I_{reset}'$ (at point 154). Here, first and second reset current conditions $I_{reset}$ and $I_{reset}'$ may be determined based on a magnitude of a compliance current applied in a previous set operation at either point 156 or 162.

In the particular embodiment of FIG. 2, a CES device may be characterized as having symmetric voltage and current conditions for write operations to place the CES in a particular impedance state. Here, as discussed above, first set voltage and current conditions ($V_{set}$ and $I_{set}$) are symmetric with second set voltage and current conditions ($V_{set}'$ and $I_{set}'$) in that $|V_{set}| \approx |V_{set}'|$ and $|I_{set}| \approx |I_{set}'|$. Likewise, first reset voltage and current conditions ($V_{reset}$ and $I_{reset}$) are symmetric with second set voltage and current conditions ($V_{reset}'$ and $I_{reset}'$) in that $|V_{reset}| \approx |V_{reset}'|$ and $|I_{reset}| \approx |I_{reset}'|$. In this context, symmetric voltage conditions for a particular write operation are polar opposite voltages of substantially the same magnitude. Similarly, symmetric current conditions for a particular write operation are polar opposite currents of substantially the same magnitude. The particular implementation of FIG. 2 illustrates operations on a CES device that are symmetric and bipolar in a current versus voltage plot. Other examples illustrated below with reference to FIGS. 5A through 5E show read and write operations on a CES device that are symmetric and bipolar in a current versus voltage plot. It should be understood, however, that read and write operations on a CES device may be bipolar in a current versus voltage plot without being symmetric, and that claimed subject matter is not limited to read and write operations on a CES device that are symmetric.

FIG. 2 illustrates that aspects of operations to place a CES element in a particular state may occur in either a first quadrant ($V_{set}$ and $I_{set}$ or $V_{reset}$ and $I_{reset}$) or a third quadrant ($V_{set}'$ and $I_{set}'$ or $V_{reset}'$ and $I_{reset}'$). According to an embodiment, and as discussed below, a bitcell incorporating a CES element having properties illustrated in FIG. 2 may perform bi-polar write operations such that set and reset operations occur in opposite quadrants. For example, a bitcell may perform write operations to place the CES element in a high impedance or insulative state by applying a first programming signal as $V_{reset}$ and $I_{reset}$ (in the first quadrant) and to place the CES element in a low impedance or conductive state by applying a second programming signal as $V_{set}'$ and $I_{set}'$ (in the third quadrant). By performing set and reset operations in opposite quadrants, a write window as $V_{set} - V_{reset}$ as shown in FIG. 1A may be increased to $|V_{set}'| + |V_{reset}|$. Alternatively, a bitcell may perform write operations to place the CES element in a high impedance or insulative state by applying a first programming signal as $V_{reset}'$ and $I_{reset}'$ (in the third quadrant) and to place the CES element in a low impedance or conductive state by applying a second programming signal as $V_{set}$ and $I_{set}$ (in the first quadrant). This similarly may expand a write window as $V_{set} - V_{reset}$ as shown in FIG. 1A to may be increased to $|V_{set}| + |V_{reset}'|$.

In addition to expanding a write window employing bi-polar write operations, bi-polar operation allows reversing flow of current through TMO material forming the CES element. Reversing current flow through TMO material in a CES element in different operations may extend the durability of the CES element subjected to multiple repetitive read and write operations over the life of a product incorporating the CES element. In a particular implementation as discussed below, over the life of a product a bitcell may apply a read signal for read operations in a first polarity and one or both programming signals in a second polarity opposite the first polarity.

For example, a bitcell and peripheral read circuit may be configured to apply a read signal to a CES element for any read operation in a first polarity. The bitcell and write driver circuit may then be configured to apply a programming signal for a particular write operation (e.g., for either a set or reset operation) to the CES element in a second polarity (opposite the first polarity) for any instance of the particular write operation. It should be understood, however, that this is merely example of read operations applied to a CES element that may have a polarity different from a polarity write operations applied to the CES element, and claimed subject matter is not limited in this respect.

In another example, a bitcell and write driver circuit may be configured to apply a programming signal for a first write operation (e.g., for a set operation) to the CES element in a first polarity for any instance of the first write operation. The bitcell and write driver circuit may then be configured to apply a second programming signal for a second write operation (e.g., for a reset operation) to the CES element in a second polarity (which is opposite the first polarity) for any instance of the second write operation. It should be understood, however, that this is merely example of instance of a first write operation applied to a CES element that may have a polarity different from a polarity a second write operation applied to the CES element, and claimed subject matter is not limited in this respect.

As shown in FIG. 1A, a read voltage $V_{read}$ may be applied in a read operation to detect the state of the CES as being in a high impedance or insulative state, or in a low impedance or conductive state. In other embodiments, a read voltage may be applied in either a first quadrant (e.g., as shown in FIG. 1A), alternatively, in a third quadrant. In a particular implementation, a read signal applied to a CES in a read operation may have a voltage polarity that is opposite of a polarity of a voltage of programming signal applied in a write operation. For example, such a read voltage may have a polarity that is opposite to a polarity of voltage of a first programming signal (e.g., $V_{set}$ or $V_{set}'$), opposite to a polarity of a voltage of a second programming signal (e.g., $V_{reset}$ or $V_{reset}'$), or both. This may further enhance durability and extend reliable use of the CES.

As pointed out above in connection with the particular embodiment of FIG. 1A, a read voltage $V_{read}$ applied in a read operation may be maintained to be below $V_{reset}$ so as to prevent change of a state of the CES element from a low impedance or conductive state to a high impedance of insulative state in a read operation.

Figure 3:
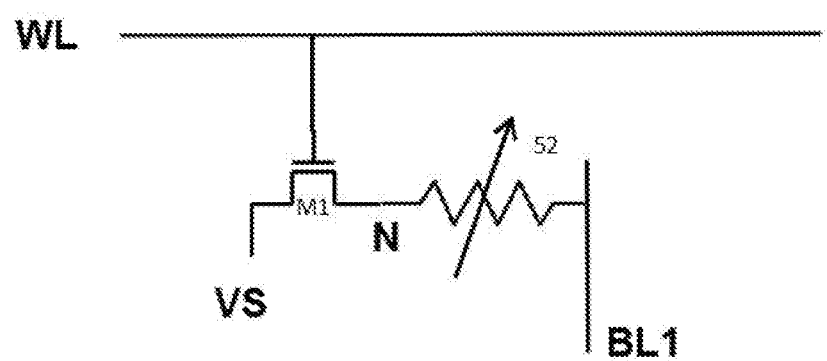
FIG. 3 is a schematic diagram of a bitcell according to a particular embodiment.

FIG. 3 is a schematic diagram of a bitcell circuit comprising a CES device 52 according to an embodiment. In this context, a "bitcell" or "bitcell circuit" as referred to herein comprises a circuit or portion of a circuit capable of representing a value, symbol or parameter as a state. For example, a bitcell may comprise one or more memory devices that capable of representing a value, symbol or parameter as a memory state of the memory device. In particular implementations, a bitcell may represent a value, symbol or parameter as a single bit or multiple bits.

According to an embodiment, a read signal having a current through FETs M2. It should be apparent that a read signal from a pre-charged bitline having a voltage VRD may apply a voltage across CES device in a read operation as $V_{read}=VRD-V_{drop}-VS$, where $V_{drop}$ is a voltage drop across FET M1. For example, $V_{read}$ may be at about 0.2 V. It should be understood that these are merely example operating voltages provided for the purpose of illustrating particular aspects of claimed subject matter, and that claimed subject matter is not limited in this respect.

In one implementation, CES element 52 may provide a CeRAM device or non-volatile memory element as specific examples of devices in a bitcell capable of maintaining an impedance state, it should be understood that these are merely example implementations. For example, it should be recognized a CES adapted for purposes other than a non-volatile memory device or CeRAM device may be used for storing a particular impedance state (e.g., a conductive or low impedance memory state, or an insulative or high impedance memory state) in a write operation which is detectable in a subsequent read operation, and that claimed subject matter is not limited to either implementation of a CeRAM or non-volatile memory devices.

According to an embodiment, an impedance state of a CES device in a bitcell may be changed or determined based on a particular voltage and current applied to a bitline. In this context, a "bitline" comprises a conductor that is connectable to at least one terminal of a memory element during a write operation to transmit a programming signal altering a memory state of the memory element, or during a read operation to transmit a signal indicative of a current memory state of the memory element. For example, providing a signal to bitline BL having a voltage $V_{reset}$ (or $V_{reset}'$) and a sufficient current $I_{reset}$ (or $I_{reset}'$) may place CES device 52 of in an insulative or high impedance memory state. Likewise, providing a signal to bitline BL having a voltage $V_{set}$ (or $V_{set}'$) and a sufficient current $I_{set}$ (or $I_{set}'$) may place a CES device 52 in a conductive or low impedance memory state.

In particular, a write operation is described as a particular process of placing a memory device such as a CES element in a particular impedance state of a plurality of predetermined impedance states by applying a "programming signal" to terminals of the memory device. Particular ones of the predetermined impedance states may correspond to particular voltage levels to be applied to the memory device (e.g., $V_{set}$ or $V_{set}'$ and $V_{reset}$ or $V_{reset}'$). Similarly, particular ones of the predetermined impedance states may correspond to particular current levels to be applied to the memory device (e.g., $I_{set}$ or $I_{set}'$ and $I_{reset}$ or $I_{reset}'$). Accordingly, in a particular embodiment, a programming signal to place a CES device in a particular impedance state in a write operation may be controlled to have a particular voltage level and current level corresponding to the particular impedance state.

In this context, a "conducting element" comprises a circuit element capable of permitting current to pass between two nodes. In a particular implementation, a conducting element may vary a current permitted to pass between nodes based, at least in part, on a particular condition. The particular implementations described herein employ FETs as conducting elements to permit current to pass between source and drain terminals based, at least in part, on a voltage applied to a gate terminal. It should be understood, however, that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

In a particular implementation, the bitcell architecture of FIG. 3 may behave as illustrated in the particular example plot shown in FIG. 2. In a particular implementation of a read operation, a bitline may be connected to a terminal of a CES element through a first conducting element in response to a voltage signal on a wordline. In this context, a "wordline" comprises a conductor for transmitting a signal to select a particular bitcell or group of bitcells to be accessed in a read operation or a write operation. In a particular example implementation, a voltage of a signal on a wordline may be raised or lowered to select or deselect a particular bitcell or group of bitcells to be connected to a corresponding bitline or group of bitlines during a read or write operation. It should be understood, however, that this is merely an example of a wordline and that claimed subject matter is not limited in this respect.

In one aspect of the particular embodiment of FIG. 3, CES element 52 may be connected to a FET M1 at a first terminal and a bitline BL1 at a second terminal. In response to a wordline voltage applied to a gate terminal of FET M1, FET M1 may connect the first terminal of CES element 52 to a voltage source VS during read or write operations. In write operations, bitline BL1 may be biased to apply an appropriate voltage (e.g., $V_{set}$, $V_{set}'$, $V_{reset}$ or $V_{reset}'$ as shown in FIG. 2) and current (e.g., $I_{set}$, $I_{set}'$, $I_{reset}$ or $I_{reset}'$ as shown in FIG. 2) across first and second terminals of CES element 52 in a write operation to place CES 52 in a desired impedance state, or to apply an appropriate voltage (e.g., $V_{read}$ or $V_{read}'$) in a read operation to detect a current impedance state. In this particular example implementation, BL1 may be connected to a write driver circuit (not shown) through an additional conducting element (not shown) in response to a wordline signal voltage.

As pointed out above, a write circuit may independently control a voltage and a current of a signal applied to CES element 52 in a write operation based, at least in part, on whether the write operation is to place CES element 52 in a conductive or low impedance memory state (e.g., in a set operation), or an insulative or high impedance memory state (e.g., in a reset operation). For example, and as depicted in FIG. 2, for a write operation to place CES element 52 in a conductive or low impedance memory state, a signal having a voltage $V_{set}$ and current $I_{set}$, or voltage $V_{set}'$ and current $I_{set}'$ may be applied. Likewise, for a write operation to place CES element 52 in an insulative or high impedance state, a signal having a voltage $V_{reset}$ and current $I_{reset}$, or voltage $V_{reset}'$ and current $I_{reset}'$ may be applied. Also as illustrated in FIG. 2, voltage $V_{set}$ may have a greater magnitude than voltage $V_{reset}$ while current $I_{set}$ may have a smaller magnitude than current $I_{reset}$. In a particular implementation, a write circuit (not shown) may independently control voltage and current to provide a signal to a bitline to place a non-volatile memory device in a conductive or low impedance memory state, or an insulative or high impedance state.

In the embodiment of FIG. 3, to detect a current impedance state of CES element 52, FET M1 may connect voltage source VS and/or other peripheral read circuitry to node N to apply a read voltage $V_{read}$ or $V_{read}'$ across first and second terminals of CES 52 in a read operation. While read voltage $V_{read}$ or $V_{read}'$ is applied, a current flowing through bitline BL1 may then be sensed (e.g., at a sense amplifier) to detect a current impedance state of CES element 52. According to an embodiment, a magnitude of a current flowing through terminals of CES element 52 during a read operation may be limited to less than the magnitude of $I_{reset}$ or $I_{reset}'$. This may prevent an unintended transition of a current state of CES element 52 in a conductive or low impedance memory state to an insulative or high impedance memory state during a read operation. Additionally, controlling a magnitude of current during a read operation may enable a magnitude of a voltage of a bitline in a read operation (e.g., voltage on bitline BLa or BLb) to be greater than or equal to a magnitude of $V_{reset}$ or $V_{reset}'$. In a particular implementation, by setting $|V_{read}| \approx |V_{reset}|$ or $|V_{read}| \approx |V_{reset}'|$, circuitry at voltage source VS to generate a read signal and a programming signal to place CES element 52 in a high impedance or insulative state may be simplified as peripheral circuitry to generate the read signal (e.g., apply a voltage at a controlled current) and a write driver circuit to generate a programming signal for a reset operation may share circuitry for generating signals at a particular voltage.

Current flowing through terminals of CES element 52 during a read operation may be controlled, for example, by controlling a current applied to a bitline by a sense amplifier. Alternatively, current flowing through terminals of CES element 52 during a read operation may be controlled by controlling a voltage applied to a gate of FET M1 during read operations. In the particular implementation of FIG. 3, FET M1 is configured as an NFET. FET M1 may be configured as a PFET in alternative implementations. In the presently illustrated embodiment, a boosted wordline voltage signal WL may be applied during a write operation to permit sufficient current flowing through CES element 52 to place CES element 52 in a particular impedance state. A voltage of wordline voltage signal WL may then be lowered during read operations to limit current flowing through CES element 52. Alternatively, voltage source VS applying a read voltage may limit a current flowing to bitline BL1 during a read operation.

Figure 4:
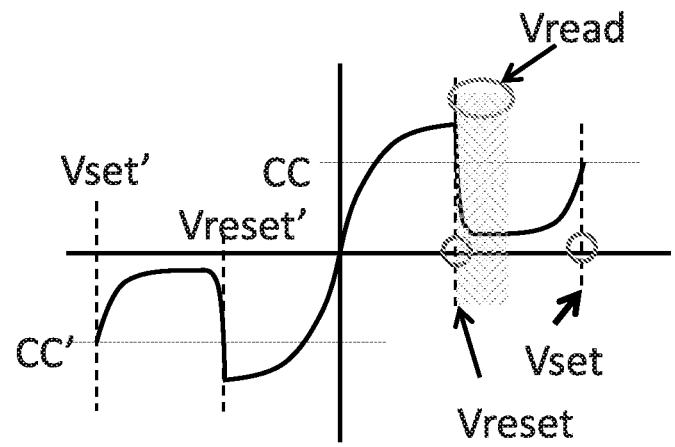
FIGS. 4 and 5 are plots illustrating read and write operations performed on CES devices according to particular embodiments.
Figure 5:
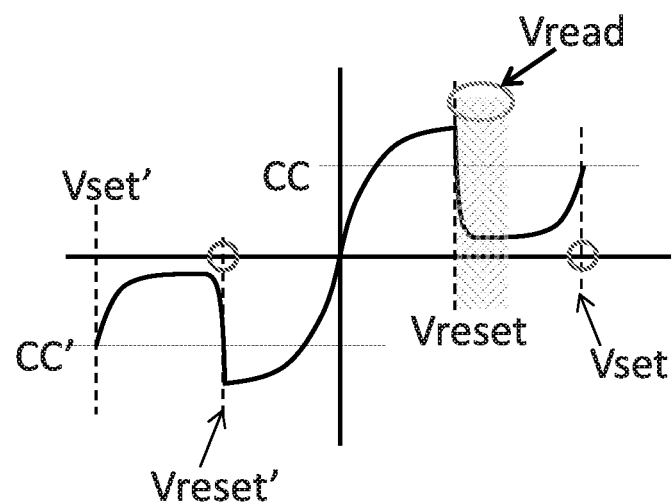

According to an embodiment, CES element 52 may have properties of a CES as illustrated in FIG. 2 enabling write operations from bipolar programming signals, and/or read operations from a read signal having a polarity that is opposite a polarity of at least one programming signal for a write operation. Table 2 below illustrates example voltages for read and write operations for the bitcell of FIG. 3. As shown in FIGS. 4 and 5, a current in CES element 52 may be limited during read operations so as to enable a magnitude of a voltage of a read signal to be equal or greater than a magnitude of a voltage to place CES element in a high impedance or insulative state in a write operation. As shown in FIG. 4, signals applied to terminals of CES element 52 according to Table 2 occur in one polarity (e.g., first quadrant). Wordline signal WL may be lowered to 0.0V if no read or write operation is occurring.

TABLE 2

| Operation | WL | BL1 | VS |
|---|---|---|---|
| Read | 1.2 V | 0.6 V-$V_{drop}$ | 0.0 V |
| Reset | 1.2 V | 0.6 V | 0.0 V |
| Set | 1.2 V | 1.2 V | 0.0 V |

In an embodiment, the same supply voltage may be used for read operations and reset operations (e.g., shown as 0.6 V in the particular example of Table 2). It may be observed, however, that bitline BL1 is maintained at a lower voltage during a read operation because of a voltage drop over conducting elements connecting the supply voltage to pre-charge bitline BL1 during read operations.

FIG. 5 illustrates a read signal and programming signals applied to CES element 52 according to Table 3, which shows a voltage of a read signal $V_{read}$ in a read operation occurring in a first quadrant. A first programming signal to place CES element 52 in a conductive or low impedance state may have a voltage $V_{set}$(e.g., in a first quadrant) and a second programming signal to place CES element 52 in an insulative or high impedance state may have a voltage $V_{reset}'$ (e.g., in a third quadrant).

TABLE 3

| Operation | WL | BL1 | VS |
|---|---|---|---|
| Read | 1.2 V | 0.6 V-$V_{drop}$ | 0.0 V |
| Reset | 1.2 V | 0.0 V | 0.6 V |
| Set | 1.2 V | 1.2 V | 0.0 V |

In the particular implementations discussed above in FIG. 5 and Table 3, three operations applied to CES element 52 are described in which either a read signal or a programming signal is applied to terminals of CES element 52. For these example cases, one of the operations applies a read signal or programming signal having a polarity that is opposite to the other two operations. This may allow for a reverse current through CES element 52 in read operations which may extend durability of CES element 52. Also, in the particular implementation of FIG. 5, programming signals for set and reset operations have voltages with opposite polarities which, as discussed above, increases the write margin of $|V_{set}|-|V_{reset}|$ (or $|V_{set}'|-|V_{reset}'|$) to $|V_{set}|+|V_{reset}|$ (or $|V_{set}'|+|V_{reset}'|$).

Figure 6:
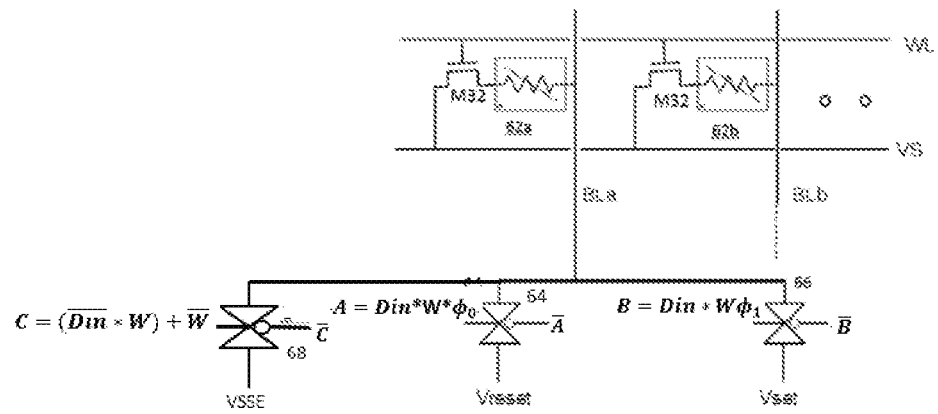
FIG. 6 is a schematic diagram of bitcells that are selectable for write operations from a single wordline voltage according to an embodiment.

FIG. 6 is a schematic diagram of bitcells 62 that are selectable for write operations from a single wordline voltage WL according to an embodiment. Raising wordline voltage WL applied to gate terminals of FETs M32 connects CES elements of bitcells 62 to a common source voltage VS during read or write operations. In a particular implementation, common source voltage VS is connected to a first terminal of multiple CES elements of (e.g., all CES elements) of bitcells 62 coupled to wordline voltage WL. In this context, a "source voltage" may comprise a particular voltage level that is maintained at a node in a circuit. In an implementation, a source voltage may be maintained by a particular circuit and a power supply. For simplicity, FIG. 6 shows only two bitcells 62a and 62b coupled to wordline voltage WL. It should be understood, however, that wordline voltage WL may be coupled to three or more bitcells to connect common source voltage VS to respective first terminals of CES elements of the bitcells.

A second terminal of the CES element of bitcell 62a is coupled to a write driver circuit comprising transmission gates 64, 66 and 68. For simplicity FIG. 6 only shows a single write driver circuit coupled to a corresponding bitcell 62a. It should be understood, however, that additional such write driver circuits may be similarly coupled to other corresponding bitcells connectable to common source voltage VS responsive to wordline voltage WL. Accordingly, it should be understood that description as to the feature of transmission gates 64, 66 and 68 may also apply to transmission gates of write driver circuits coupled to other corresponding bitcells connectable to common source voltage VS responsive to wordline voltage WL. In the presently illustrated embodiment, and as discussed below, transmission gate 64 may be closed to apply a voltage $V_{reset}$ to bitline BLa responsive to a condition "A" including a state of a write enable signal W during a phase $\phi_0$ of a write operation and a value of Din to be written to a bitcell coupled to the bitline BLa. Similarly, transmission gate 66 may be closed to apply a voltage $V_{set}$ to bitline responsive to a condition "B" including a state of the write enable signal W during a phase $\phi_1$ of a write operation and a value of Din to be written to a bitcell coupled to the bitline BLa. Likewise, transmission gate 68 may be closed to apply common source voltage VSSE (e.g., a ground voltage) to bitline BLa responsive to a condition "C" including the opposite of write enable signal W, the opposite of a value of Din to be written to a bitcell.

According to an embodiment, bitcells connectable to common source voltage VS and responsive to wordline voltage WL (e.g., bitcells 62a and 62b, and/or other bitcells 62) may be simultaneously accessed in write operations to place the individual bitcells in particular associated intended impedance states. Depending on a particular value to be represented or expressed in the bitcells, individual bitcells may be accessed for a set or reset operation as discussed above. To place individual bitcells connectable to common source voltage VS responsive to wordline voltage WL in intended impedance states, these bitcells may be simultaneously accessed in two phases: a first phase to place a first set of selected bitcells in a high impedance or insulative state; and a second phase to place a second set of selected bitcells (different from the first set of selected bitcells) in a low impedance or conductive state. It should be understood, however, that actions performed in the first and second phases may be performed in a reverse order without deviating from claimed subject matter. For example, a first phase may instead place a first set of selected bitcells in a low impedance or conductive state; and a second phase to place a second set of selected bitcells (different from the first set of selected bitcells) in a high impedance or insulative state. According to an embodiment, the first set of selected bitcells and the second set of selected bitcells may or may not comprise mutually exclusive and exhaustively complete portions of bitcells which are connectable to common source voltage VS responsive to wordline voltage WL.

Figure 7:
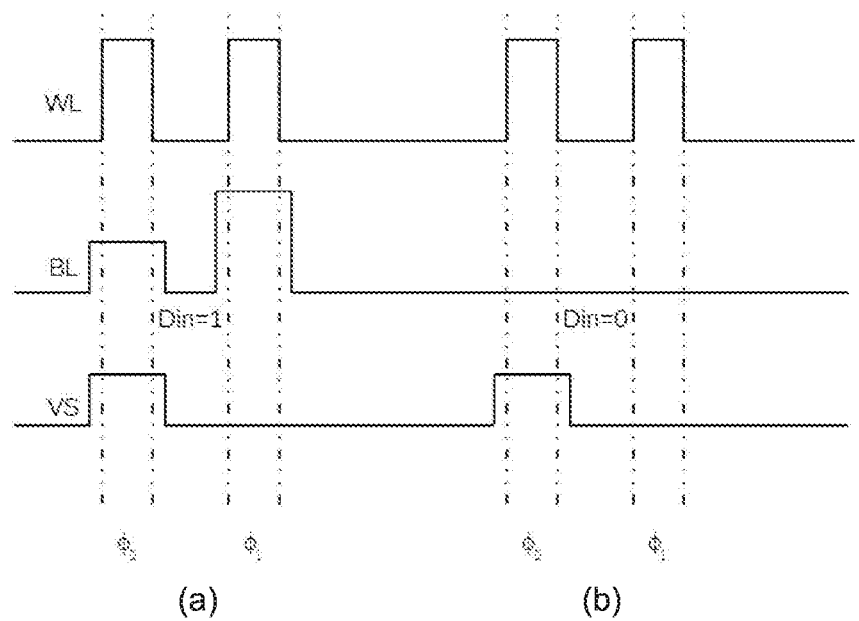
FIG. 7 is a signal timing diagram illustrating a timing of signals applied to a CES device in a bitcell according to an embodiment.

FIG. 7 is a signal timing diagram illustrating a timing of signals applied to a CES device in a bitcell of a two-phase operation according to an embodiment. In a particular example implementation, the bitcell may be one of multiple bitcells connectable to common source voltage VS responsive to wordline voltage WL (e.g., bitcells 62a and 62b) as described above. In a first phase $\phi_0$, a first set of selected bitcells (e.g., among bitcells 62) may be placed in a high impedance or insulative state (e.g., in reset operations applied to the first set of selected bitcells). In a second phase $\phi_1$, a second set of selected bitcells (e.g., different from the first set of selected bitcells) may be placed in a low impedance or conductive state (e.g., in set operations applied to the second set of selected bitcells). As may be observed, for all bitcells connectable to common source voltage VS and responsive to wordline voltage WL, common source voltage VS may be maintained at a first voltage in the first phase $\phi_0$ and lowered to a second voltage in the second phase $\phi_1$. A bitline BL connected to a particular bitcell may be placed at a particular voltage on the first phase $\phi_0$ or second phase $\phi_1$, depending on whether a CES of the bitcell is to be placed in a high impedance or insulative state, placed in a low impedance or conductive state, or to be maintained unchanged in its current impedance state.

The particular example of FIG. 7 shows two instances (a) and (b) of first and second phases $\phi_0$ and $\phi_1$ applied to a bitcell or different bitcells (e.g., bitcells 62a and 62b) according to an embodiment. For example, all bitcells connectable to common source voltage VS responsive to wordline voltage WL may be accessed in phases $\phi_0$ and $\phi_1$. As shown, common source voltage VS is maintained at a first voltage in the first phase $\phi_0$ and lowered to a second voltage in the second phase $\phi_1$. In first phase $\phi_0$ of instance (a), a voltage on bitline BL is maintained at the same voltage as common source voltage VS, thus placing 0.0 V across terminals of a CES device connected to bitline BL so that the impedance state of the CES device is maintained unchanged in its current impedance state. In second phase $\phi_1$ of instance (a), common source voltage VS is lowered and a difference between common source voltage VS voltage and a voltage on bitline BL is sufficient to initiate a set operation (e.g., at $V_{set}$ or $V_{set}'$) to place the CES device in a low impedance or conductive state. In the particular implementation of FIG. 6, transmission gate 68 may close in first phase $\phi_0$ and second phase $\phi_1$ of instance (b) or while a clock signal controlling signal W (not shown) is low to maintain bitline BL at voltage VSSE (e.g., ground).

In first phase $\phi_0$ of instance (b), a difference between common source voltage VS voltage and a voltage on bitline BL is sufficient to initiate a reset operation (e.g., at $V_{reset}$ or $V_{reset}'$) to place the CES device in a high impedance or insulative state. In second phase $\phi_1$ of instance (b), common source voltage VS is lowered and common source voltage VS is maintained at the same voltage as a voltage on bitline BL. This may place 0.0V across terminals of a CES device connected to bitline BL so that the impedance state of the CES device is maintained unchanged in its current impedance state.

As may be observed from FIG. 7, a programming signal applied across terminals of a CES device in phase $\phi_1$ of instance (a) (e.g., for a set operation) has a first polarity. A programming signal applied across terminals of a CES device in phase $\phi_0$ of instance (b) (e.g., for a reset operation) has a second polarity opposite the first polarity. Accordingly, the particular implementation of FIG. 7 may enable one or more of the aforementioned advantages discussed above in connection with a set operation applying a current in a CES device in a first direction and a reset operation applying a current in the CES device in a second direction opposite the first direction (e.g., as shown in FIG. 5).

According to an embodiment, signals according to FIG. 7 may be implemented with transmission gates 64 and 66 shown in FIG. 6. During a phase $\phi_0$ of an operation to write to bitcells connected to common voltage source VS, transmission gate 66 may be opened such that voltage $V_{set}$ is not connected to bitline BLa, and transmission gate 64 may be selectively closed to connect voltage $V_{reset}$ to bitline BLa if an intended data value for bitcell 62a Din is "1." During a phase $\phi_1$ of an operation to write to bitcells connected to common voltage source VS, transmission gate 64 may be opened such that voltage $V_{reset}$ is not connected to bitline BLa, and transmission gate 66 may be selectively closed to connect voltage $V_{set}$ to bitline BLa if an intended data value for bitcell 62a Din is "1." In a further embodiment, one or more of a plurality of CEM devices (e.g., CES devices) may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment. In a further embodiment, CEM devices may be formed in devices in combination with conducting elements as described herein formed by the same or different processes. In an example implementation, CEM devices may be formed in combination with conducting elements using a different and/or complementary process technologies such as complementary metal oxide semiconductor (CMOS) technologies.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A device comprising:
    a plurality of memory elements, each of the memory elements comprising a first terminal coupled to a common source voltage and a second terminal coupled to a bitline corresponding to the memory element; and
    a driver circuit configured to apply a first programming signal across the first and second terminals of at least one of the memory elements to place the memory element in a conductive or low impedance state, and configured to apply a second programming signal across the first and second terminals of the at least one of the memory elements to place the memory element in an insulative or high impedance state,
    wherein the first programming signal comprises a first voltage and a first current and the second programming signal comprises a second voltage and a second current, and wherein the first and second voltages have opposite polarity and the first and second currents have opposite polarity, and
    wherein the driver circuit is configured to place individual ones of the memory elements in intended impedance states by applying the first programming signal to first selected memory elements of the plurality of memory elements in a first phase to place the first selected memory elements in the insulative or high impedance state, and by applying the second programming signal to second selected memory elements of the plurality of memory elements in a second phase to place the second selected memory elements in the conductive or low impedance state.

2. The device of claim 1, wherein current flows between the first and second terminals of the first selected memory elements in a first direction in response to the first programming signal in the first phase, and wherein current flows between the first and second terminals of the second selected memory elements in a second direction opposite the first direction in response to the second programming signal in the second phase.

3. The device of claim 1, wherein the common source voltage is connected to the first terminals of the memory elements during the first and second phases, and wherein the source voltage is maintained at a first voltage level during the first phase and maintained at a second voltage level during the second phase.

4. The device of claim 1, wherein the driver circuit is further configured to control voltages of bitlines coupled to the first memory elements during the second phase to maintain the first selected memory elements in the insulative or high impedance state.

5. A device comprising:
    a plurality of memory elements, each of the memory elements comprising a first terminal coupled to a common source voltage and a second terminal coupled to a bitline corresponding to the memory element; and
    a driver circuit configured to apply a first programming signal across the first and second terminals of at least one of the memory elements to place the memory element in a conductive or low impedance state, and configured to apply a second programming signal across the first and second terminals of the at least one of the memory elements to place the memory element in an insulative or high impedance state,
    wherein the first programming signal comprises a first voltage and a first current, and the second programming signal comprises a second voltage and a second current, and wherein the first and second voltages have opposite polarity and the first and second currents have opposite polarity, and
        wherein the driver circuit is configured to place individual ones of the memory elements in intended impedance states by applying the first programming signal to first selected memory elements of the plurality of memory elements in a first phase to place the first selected memory elements in the low impedance or conductive state, and by applying the second programming signal to second selected memory elements of the plurality of memory elements in a second phase to place the second selected memory elements in the high impedance or insulative state.

6. The device of claim 5, wherein current flows between the first and second terminals of the first selected memory elements in a first direction in response to the first programming signal in the first phase, and wherein current flows between the first and second terminals of the second selected memory elements in a second direction opposite the first direction in response to the second programming signal in the second phase.

7. The device of claim 5, wherein the driver circuit is further configured to control voltages of bitlines coupled to the first selected memory elements during the second phase to maintain the first memory elements in the conductive or low impedance state.

8. The device of claim 1, wherein the memory elements in the plurality of memory elements are selectable for write operations in response to a voltage on a single wordline.

9. The device of claim 8, wherein the common source voltage is connected to first terminals of the memory elements in response to the voltage on the single wordline.

10. The device of claim 1, wherein the plurality of memory elements comprise correlated electron switch (CES) elements.

11. The device of claim 5, wherein the memory elements in the plurality of memory elements are selectable for write operations in response to a voltage on a single wordline.

12. The device of claim 11, wherein the common source voltage is connected to first terminals of the memory elements in response to the voltage on the single wordline.

13. The device of claim 5, wherein the plurality of memory elements comprise correlated electron switch (CES) elements.

* * * * *